(12) United States Patent
Shieh et al.

(10) Patent No.: US 9,099,563 B2
(45) Date of Patent: Aug. 4, 2015

(54) STABLE AMORPHOUS METAL OXIDE SEMICONDUCTOR

(71) Applicants: Chan-Long Shieh, Paradise Valley, AZ (US); Gang Yu, Santa Barbara, CA (US)

(72) Inventors: Chan-Long Shieh, Paradise Valley, AZ (US); Gang Yu, Santa Barbara, CA (US)

(73) Assignee: CBRITE INC., Goleta, CA (US)

( * ) Notice: Subject to any disclaimer, the term of this patent is extended or adjusted under 35 U.S.C. 154(b) by 0 days.

(21) Appl. No.: 14/552,641

(22) Filed: Nov. 25, 2014

(65) Prior Publication Data

US 2015/0115260 A1     Apr. 30, 2015

Related U.S. Application Data

(63) Continuation of application No. 12/206,615, filed on Sep. 8, 2008, and a continuation of application No. 13/758,293, filed on Feb. 4, 2013, now Pat. No. 8,907,336.

(51) Int. Cl.
| | |
|---|---|
| *H01L 29/10* | (2006.01) |
| *H01L 29/786* | (2006.01) |
| *H01L 29/04* | (2006.01) |
| *H01L 27/12* | (2006.01) |
| *H01L 21/16* | (2006.01) |
| *H01L 21/00* | (2006.01) |

(52) U.S. Cl.
CPC ...... *H01L 29/78693* (2013.01); *H01L 27/1225* (2013.01); *H01L 29/04* (2013.01); *H01L 21/00* (2013.01); *H01L 21/16* (2013.01); *H01L 29/7869* (2013.01)

(58) Field of Classification Search
CPC .... H01L 29/7869; H01L 121/16; H01L 21/00
USPC ............................................ 257/43; 438/681
See application file for complete search history.

(56) References Cited

U.S. PATENT DOCUMENTS

2006/0110867 A1*  5/2006  Yabuta et al. ................ 438/151
2008/0299771 A1* 12/2008  Irving et al. ................. 438/681

* cited by examiner

*Primary Examiner* — Dale E Page
(74) *Attorney, Agent, or Firm* — Robert A. Parsons; Michael W. Goltry; Parsons & Goltry

(57) ABSTRACT

A thin film semiconductor device has a semiconductor layer including a mixture of an amorphous semiconductor ionic metal oxide and an amorphous insulating covalent metal oxide. A pair of terminals is positioned in communication with the semiconductor layer and define a conductive channel, and a gate terminal is positioned in communication with the conductive channel and further positioned to control conduction of the channel. The invention further includes a method of depositing the mixture including using nitrogen during the deposition process to control the carrier concentration in the resulting semiconductor layer.

25 Claims, 2 Drawing Sheets

1

STABLE AMORPHOUS METAL OXIDE SEMICONDUCTOR

CROSS-REFERENCE TO RELATED APPLICATIONS

This application is a continuation application of currently pending U.S. application Ser. No. 12/206,615, filed 8 Sep. 2008 and currently pending U.S. application Ser. No. 13/758,293, filed 4 Feb. 2013.

FIELD OF THE INVENTION

This invention relates to metal oxide semiconductor material for use in channel layers of semiconductor devices.

BACKGROUND OF THE INVENTION

In the semiconductor industry and especially thin film semiconductor devices such as thin film transistors (TFTs), the devices include spaced apart source and drain areas that conduct through a channel layer positioned therebetween. At least one gate insulator and gate electrode are positioned above and/or below the channel layer, to control the conduction. In many applications TFTs are used where high heat cannot be tolerated during fabrication and, thus, a semiconductor must be used that can be deposited at relatively low temperatures (e.g. room temperature) but which still has relatively high mobility.

There is a strong interest in metal oxide semiconductor because of its high carrier mobility, light transparency and low deposition temperature. The high carrier mobility expands applications to higher performance domains that require higher frequency or higher current. The light transparency eliminates the need for a light shield in display and sensor active matrices. The low deposition temperature enables application to flexible electronics on plastic substrates.

The unique features of metal oxide semiconductors are: (1) carrier mobility is less dependent on grain size of films, that is, high mobility amorphous metal oxide is possible; (2) density of surface states is low and enables easy field effect for TFTs, this is contrary to covalent semiconductors (such as Si or a-Si) where surface states have to be passivated by hydrogen; and (3) mobility strongly depends on the volume carrier density. In order to achieve high mobility for high performance applications, the volume carrier density of the metal oxide channel should be high and thickness of the metal oxide film should be small (e.g. <100 nm and preferably <50 nm).

However, a major deficiency of metal oxide semiconductors is stability and the tendency to become polycrystalline at higher process temperatures. Popular metal oxides, such as zinc oxide, indium zinc oxide, and indium gallium zinc oxide, are not very stable and become polycrystalline at moderate process temperatures (e.g. greater than approximately 400° C.) Polycrystalline semiconductor metal oxides are not desirable in semiconductor devices for several reasons. For example, the characteristics of transistors formed in polycrystalline semiconductor metal oxides can vary, even between adjacent devices in an array, because of the variation in crystal size and position. To better understand this problem, in a conduction area under a sub-micron gate each different transistor can include from one or two poly-silicon crystalline grains to several crystalline grains and the different number of crystals in the conduction area will produce different characteristics. The dimensions and their physical characteristics among different grains are also different.

The stability of metal oxide thin film transistors (TFTs) depends strongly on processing temperatures. At high temperatures, the traps in the bulk semiconductor layer and at the interface or interfaces between the gate insulator and the semiconductor layer can be reduced. For applications, such as active matrix organic light emitting devices (AMOLED), extreme stability is required. It is advantageous to take the metal oxide TFTs to high temperatures, generally between 250° C. and 700° C., during processing. Meanwhile it is desirable to maintain the amorphous nature of the metal oxide at these processing temperatures.

It would be highly advantageous, therefore, to remedy the foregoing and other deficiencies inherent in the prior art.

Accordingly, it is an object of the present invention to provide a new and improved metal oxide semiconductor material.

Another object of the invention is to provide a new and improved metal oxide semiconductor material with improved stability and has less tendency to become polycrystalline at higher processing temperatures.

Another object of the invention is to provide a new and improved metal oxide semiconductor material with improved stability, high carrier mobility, and good control of oxygen vacancies and carrier density.

SUMMARY OF THE INVENTION

Briefly, to achieve the desired objects of the instant invention in accordance with a preferred embodiment thereof, a stable amorphous metal oxide material is provided for use as a semiconductor in semiconductor devices, the material includes a mixture of an amorphous semiconductor ionic metal oxide and an amorphous insulating covalent metal oxide. The stable amorphous metal oxide material is represented by one of the formula $XO_aYO_b$, and X—O—Y, where YO is an amorphous insulating covalent metal oxide and XO is an amorphous semiconductor ionic metal oxide.

The desired objects of the instant invention are further achieved in a thin film semiconductor device having a semiconductor layer including a mixture of an amorphous semiconductor ionic metal oxide and an amorphous insulating covalent metal oxide. A pair of terminals is positioned in communication with the semiconductor layer and define a conductive channel, and a gate terminal is positioned in communication with the conductive channel and further positioned to control conduction of the channel.

The invention further includes a method of depositing the mixture including using nitrogen during the deposition process to control the carrier concentration in the resulting semiconductor layer.

BRIEF DESCRIPTION OF THE DRAWING

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF A PREFERRED EMBODIMENT

Figure 1:
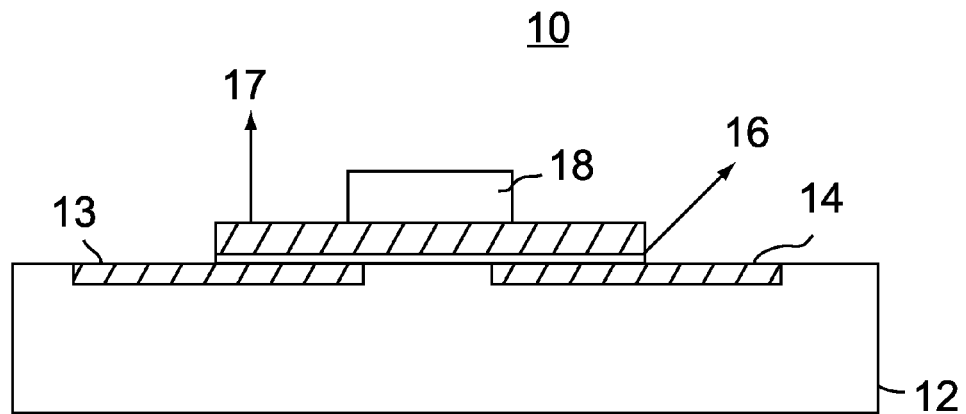
FIG. 1 is a simplified layer diagram of a TFT in accordance with the present invention with overlying gate and underlying source/drain.

Turning now to FIG. 1, a simplified layer diagram of one embodiment of a TFT 10, in accordance with the present invention, is illustrated. TFT 10 includes a substrate 12, which may be a flexible material, such as plastic, or any other convenient material, such as glass, etc. A source 13 and a drain 14 are formed in or on (hereinafter generically referred to as "on") the upper surface of substrate 12 in a spaced apart orientation using any well known method. A metal oxide film 16 is formed in partial overlying relationship to both source 13 and drain 14 and the space therebetween. It will be understood that metal oxide film 16 is the active layer that conducts carriers between the source/drain components. In a preferred embodiment, metal oxide layer 16 is less than 100 nm thick and preferably less than 50 nm. A thin gate dielectric layer 17 is formed in overlying relationship to metal oxide film 16 and a gate stack 18 is positioned on gate dielectric layer 17 in overlying relationship to the space between source 13 and drain 14. Thus, TFT 10 is a top gate, bottom source/drain type of device.

Figure 2:
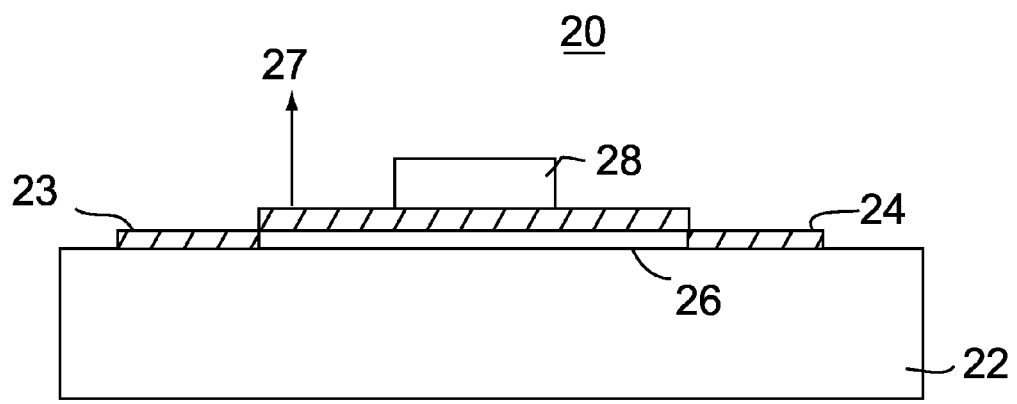
FIG. 2 is a simplified layer diagram of a TFT in accordance with the present invention with overlying gate and overlying source/drain.

Turning now to FIG. 2, a simplified layer diagram of another embodiment of a TFT 20, in accordance with the present invention, is illustrated. TFT 20 includes a substrate 22, which may be a flexible material, such as plastic, or any other convenient material, such as glass, etc. A metal oxide film 26 is deposited on substrate 22 and a source 23 and a drain 24 are formed partially in overlying relationship on the upper surface of metal oxide film 26 so as to form a spaced apart orientation on the upper surface. A thin gate dielectric layer 27 is formed in overlying relationship to metal oxide film 26 in the space between gate 23 and gate 24 and to portions of gate 23 and gate 24 adjacent to the space. A gate stack 28 is positioned on gate dielectric layer 27 in overlying relationship to the space between source 23 and drain 24. Thus, TFT 20 is a top gate, top source/drain type of device.

Figure 3:
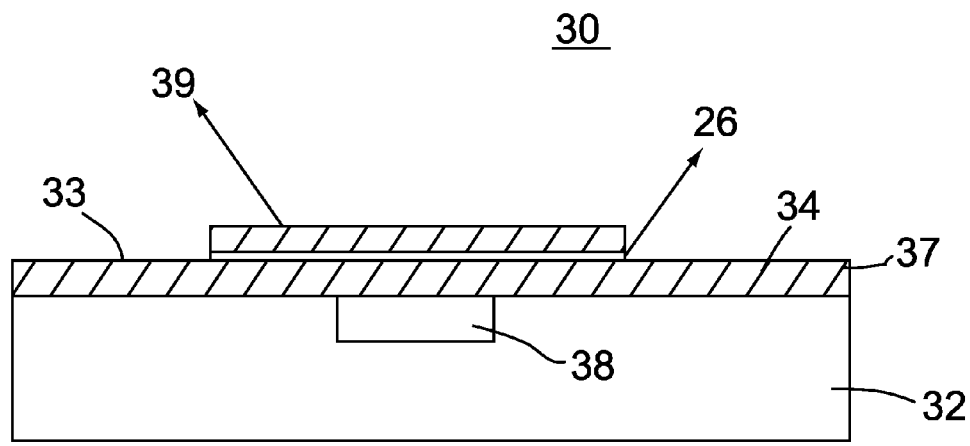
FIG. 3 is a simplified layer diagram of a TFT in accordance with the present invention with underlying gate and underlying source/drain.

Turning now to FIG. 3, a simplified layer diagram of another embodiment of a TFT 30, in accordance with the present invention, is illustrated. TFT 30 includes a substrate 32, which may be a flexible material, such as plastic, or any other convenient material, such as glass, etc. A gate stack 38 is formed in substrate 32 by any convenient and established method. A thin gate dielectric layer 37 is formed in overlying relationship to gate stack 38 and the surrounding areas of substrate 32. A source 33 and a drain 34 are formed in or on (hereinafter generically referred to as "on") the upper surface of gate dielectric layer 37 in a spaced apart orientation using any well known method. A metal oxide film 36 is formed in partial overlying relationship to both source 33 and drain 34 and the space therebetween. An optional passivation layer 39 is formed over metal oxide film 36. Thus, TFT 30 is a bottom gate, bottom source/drain type of device.

Figure 4:
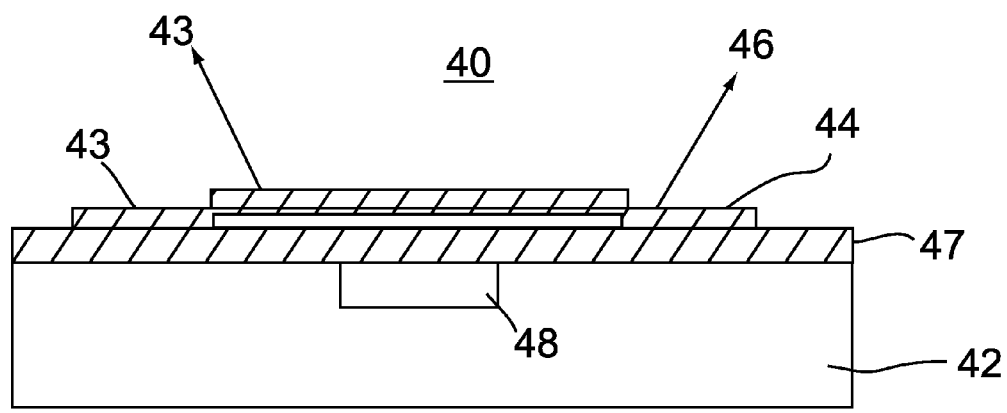
FIG. 4 is a simplified layer diagram of a TFT in accordance with the present invention with underlying gate and overlying source/drain.

Turning now to FIG. 4, a simplified layer diagram of another embodiment of a TFT 40, in accordance with the present invention, is illustrated. TFT 40 includes a substrate 42, which may be a flexible material, such as plastic, or any other convenient material, such as glass, etc. A gate stack 48 is formed in substrate 42 by any convenient and established method. A thin gate dielectric layer 47 is formed in overlying relationship to gate stack 48 and the surrounding areas of substrate 42. A metal oxide film 46 is formed on gate dielectric layer 47 in overlying relationship to gate stack 48 and the surrounding area. A source 43 and a drain 44 are formed partially in overlying relationship on the upper surface of metal oxide film 46 so as to define a space therebetween on the upper surface overlying gate stack 48. An optional passivation layer 49 is formed over the exposed portion of metal oxide film 46 and the surrounding portions of source 43 and drain 44. Thus, TFT 40 is a bottom gate, top source/drain type of device.

It will be understood that the above four examples of thin film transistors illustrate only some of the possible embodiments. For example, each of the above examples is a single gate transistor. Double gate transistors, i.e. a gate above and below the channel, are known in conjunction with virtually all of the examples. It is intended that the present invention applies to all possible or potential thin film transistors and other thin film devices, e.g. diodes, etc. Further, for purposes of this disclosure it will be understood that in all of the TFT examples the metal oxide film is defined as being "deposited on the substrate", even if a film is interposed therebetween.

Amorphous metal oxide semiconductor materials are desirable for use in the channel layer of semiconductor devices because of their high carrier mobility. For purposes of this disclosure, metal oxide semiconductor materials include at least one of zinc oxide, indium oxide, tin oxide, gallium oxide, cadmium oxide, or any combinations thereof. However, metal oxide semiconductors are relatively unstable and have a tendency to become polycrystalline at higher temperatures. Polycrystalline semiconductor metal oxides are not desirable in semiconductor devices because of the many drawbacks in their structure, including the relatively large grain size.

It is known in the art that the channel length of presently standard thin film transistors is less than approximately 5 microns. For purposes of this disclosure the term "amorphous" is defined as a material with grain size, along the channel length, much less than the channel length of presently standard thin film transistors, e.g. approximately 100 nanometers or less.

Some amorphous metal oxides, such as aluminum oxide, boron oxide, silicon oxide, magnesium oxide, beryllium oxide, and combinations thereof, are very stable and do not become polycrystalline easily. However, these metal oxides are not good semiconductors and cannot be used in semiconductor devices in their normal state.

It has been found that the stability of amorphous metal oxide semiconductor materials can be greatly improved by mixing some amorphous insulating metal oxides with amorphous metal oxide semiconductor materials. However, because the insulating amorphous metal oxides are virtually non-conducting, it is necessary to provide a continuous network of the amorphous metal oxide semiconductor materials through the resulting mixture. Thus, carrier flow is not interrupted by the amorphous metal oxide insulating materials mixed with the amorphous metal oxide semiconductor materials and mobility of the composite oxide can be high. Thus, the stability of the composite oxides is enhanced by the stable oxide component but the mobility remains high. Further, it will be understood that several different types of insulating amorphous metal oxides with different valences or other characteristics may be included in a composite mixture to achieve different results, at least one result being enhanced stability.

Some typical insulating amorphous metal oxides that can be used in a composite mixture include AlO, SiO, MgO, BeO, BO, and the like, and combinations thereof. Generally, the insulating amorphous metal oxides are more covalent in nature with a relatively high energy gap that is $E_g$ greater than approximately 6 eV. For ease of understanding, the insulating amorphous metal oxides may be referred to generically as 'covalent metal oxides'.

Generally, the amorphous metal oxide semiconductor materials are more, or practically, ionic in nature with a relatively low energy gap, that is $E_g$ less than approximately 4 eV. For ease of understanding, the semiconducting amorphous metal oxides may be referred to generically as 'ionic metal oxides'.

Different valence metals, i.e. metals from different groups in the periodic table, and mixtures thereof can be used to enhance stability or desirable semiconductor characteristics in a composite mixture. It will be understood that some covalent metal oxides will add more stability because they have a greater tendency not to crystallize (e.g. a higher energy gap). Also, the amount of stable or covalent metal oxide added to the composite mixture is determined by the necessity to maintain a continuous network of the amorphous metal oxide semiconductor materials.

In the present composite mixture, the amorphous metal oxide semiconductor materials are represented by XO and the insulating amorphous metal oxides are represented by YO. Thus, a formula for the composite mixture can be described as $XO_aYO_b$, where 'a' is the amount of amorphous metal oxide semiconductor material (ionic metal oxide) in the composite mixture and 'b' is the amount of insulating amorphous metal oxide material (covalent metal oxide) in the composite mixture. It should be understood that 'a' and 'b' are non-zero (greater than zero) and to comply with the requirement that the composite mixture include a continuous network of the amorphous metal oxide semiconductor materials, 'a' will generally be larger than 'b'. Preferably, b is larger than approximately 5% of the total material. Also, the amount of amorphous semiconductor ionic metal oxide is preferably greater than approximately 17% of the mixture.

The amorphous semiconductor ionic metal (X) and amorphous insulating covalent metal (Y) in the composite mixture, can in some instances form an atomic bond directly with oxygen, represented as X—O—Y herein. In such instances it should be understood that the formula X—O—Y simply replaces the formula $XO_aYO_b$. Further, it will be understood that in either instance a mixture of an amorphous semiconductor ionic metal oxide and an amorphous insulating covalent metal oxide is included in the stable amorphous metal oxide material.

One other problem that arises from mixing a stable metal oxide with an amorphous metal oxide semiconductor material is that the stable metal oxide tends to reduce the oxygen vacancies. If oxygen is used during deposition in the normal procedure (i.e. less than 5%), the oxygen vacancies can be substantially reduced and the conduction (mobility) of the composite material can become too low. For example, it has been found that by using oxygen during the deposition, carriers are decreased to less than $10^{18}$ carriers per $cm^3$. Thus, the use of oxygen to control the carrier concentration in the composite mixture, while it is possible, is very difficult and sensitive.

Instead of using oxygen to control the carrier concentration during deposition, it has been found that nitrogen ($N_2$) can used to reduce the carrier concentration. The presence of $N_2$ during deposition can reduce the carrier concentration, but not as strongly as oxygen because nitrogen is less reactive compared to oxygen. Thus, the use of nitrogen is less sensitive and it is easier to achieve the desired result.

Thus, a new and improved metal oxide semiconductor material has been disclosed that has improved stability and has less tendency to become polycrystalline at higher temperatures. Also, the new and improved metal oxide semiconductor material has high carrier mobility and good control of oxygen vacancies.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. A thin film semiconductor device comprising:
   a semiconductor layer;
   source/drain electrodes positioned in communication with the semiconductor layer and defining a conductive channel in the semiconductor layer;
   a gate electrode in communication with the conductive channel and positioned to control conduction of the channel;
   the semiconductor layer including an amorphous insulating covalent metal oxide material and an amorphous semiconductor ionic metal oxide material;
   the amorphous insulating covalent metal oxide material and the amorphous semiconductor ionic metal oxide material being mixed in a predetermined ratio that forms a continuous network of the amorphous semiconductor ionic metal oxide material and prevents the amorphous semiconductor ionic metal oxide material from becoming poly crystalline at processing temperatures;
   the mixture of the amorphous insulating covalent metal oxide material and the amorphous semiconductor ionic metal oxide material being deposited in an orientation supported by a substrate in one of a top gate bottom source/drain electrodes; top gate top source/drain electrodes; bottom gate bottom source drain electrodes; and bottom gate top source drain configuration electrodes; and
   the mixture of the amorphous insulating covalent metal oxide material and the amorphous semiconductor ionic metal oxide material having a carrier concentration determined by one of oxygen and nitrogen being included during the deposition.

2. The thin film semiconductor device as claimed in claim 1 wherein the device is the top gate, bottom source/drain electrodes orientation comprising:
   the substrate;
   the source/drain electrodes positioned on the upper surface of the substrate in a spaced apart orientation;
   the semiconductor layer positioned in partial overlying relationship to both the source/drain electrodes and the space there-between;
   a gate dielectric layer positioned over the semiconductor layer; and
   the gate electrode positioned on the gate dielectric layer in overlying relationship to the space between the source/drain electrodes.

3. The thin film semiconductor device as claimed in claim 1 wherein the device is the top gate, top source/drain electrodes orientation comprising:
   the substrate;
   the semiconductor layer positioned on the substrate;
   the source/drain electrodes positioned in overlying relationship on the upper surface of the semiconductor layer and spaced apart;

a gate dielectric layer in overlying relationship to portions of the source/drain electrodes and to the semiconductor layer in between; and the gate electrode positioned on the gate dielectric layer in overlying relationship to the space between the source/drain electrodes.

4. The thin film semiconductor device as claimed in claim 1 wherein the device is the bottom gate, bottom source/drain electrodes orientation comprising:
the substrate;
the gate electrode positioned on the substrate;
a gate dielectric layer positioned in overlying relationship to the gate electrode and the surrounding areas of the substrate;
the source/drain electrodes positioned on the upper surface of the gate dielectric layer with a space in between and overlying the gate electrode;
the semiconductor layer positioned over and in partial overlying relationship to both the source/drain electrodes and the space there-between; and
a passivation layer positioned over the semiconductor layer.

5. The thin film semiconductor device as claimed in claim 1 wherein the device is the bottom gate, top source/drain electrodes orientation comprising:
the substrate;
the gate electrode positioned on the substrate;
a gate dielectric layer in overlying relationship to the gate electrode and surrounding areas of the substrate;
the semiconductor layer positioned on top of the gate dielectric layer and in overlaying relationship with the gate electrode;
the source/drain electrodes positioned in a spaced apart relationship on the upper surface of the semiconductor layer, and the space being in overlying relationship with the gate electrode; and
passivation material positioned at least partially over the source/drain electrodes and over the semiconductor layer there-between.

6. The thin film semiconductor device as claimed in claim 1 wherein the substrate is a glass or plastic sheet.

7. The thin film semiconductor device as claimed in claim 1 wherein the substrate is one of rigid or flexible.

8. The thin film semiconductor device as claimed in claim 1 wherein the amorphous semiconductor ionic metal oxide material has a grain size equal to or smaller than 100 nm.

9. The thin film semiconductor device as claimed in claim 1 wherein the device is incorporated into thin film circuit applications including display and sensor active matrices.

10. The thin film semiconductor device as claimed in claim 1 wherein the device is incorporated into an active matrix organic light emitting display.

11. The thin film semiconductor device as claimed in claim 1 wherein the amorphous semiconductor ionic metal oxide in the mixture is in an amount much greater than the amorphous insulating covalent metal oxide.

12. The thin film semiconductor device as claimed in claim 11 wherein the amount of amorphous semiconductor ionic metal oxide in the mixture is greater than approximately 17% of the mixture.

13. The thin film semiconductor device as claimed in claim 1 wherein the amount of amorphous insulating covalent metal oxide is sufficient to prevent the amorphous semiconductor ionic metal oxide from becoming poly crystalline at processing temperatures in a range of approximately 250° C. to approximately 700° C.

14. The thin film semiconductor device as claimed in claim 1 wherein the amorphous insulating covalent metal oxide in the mixture is greater than approximately 5% of the mixture.

15. The thin film semiconductor device as claimed in claim 1 wherein the amorphous semiconductor ionic metal oxide includes one of zinc oxide, indium oxide, tin oxide, gallium oxide, cadmium oxide, or combinations thereof.

16. The thin film semiconductor device as claimed in claim 1 wherein the amorphous insulating covalent metal oxide includes one of aluminum oxide, silicon oxide, magnesium oxide, beryllium oxide, boron oxide, or combinations thereof.

17. The thin film semiconductor device as claimed in claim 1 wherein the mixture is represented by the formula $XO_aYO_b$, where YO is an amorphous insulating covalent metal oxide and XO is an amorphous semiconductor ionic metal oxide and where 'a' is the amount of amorphous semiconductor ionic metal oxide in the composite mixture and 'b' is the amount of amorphous insulating covalent metal oxide in the composite mixture and where 'a' and 'b' are >0.

18. The thin film semiconductor device as claimed in claim 1 wherein the mixture comprises metal oxide bonds in the form of X—O—Y, wherein the oxygen atom is bonded with a metal atom Y which is originated from the amorphous insulating covalent metal oxide YO as well as bonded with a metal atom X which is originated from the semiconductor ionic metal oxide XO.

19. The thin film semiconductor device as claimed in claim 1 wherein the amorphous semiconductor ionic metal oxide is characterized by an energy gap less than approximately 4 ev and the amorphous insulating covalent metal oxide is characterized by an energy gap greater than approximately 6 ev.

20. A thin film semiconductor device comprising:
a semiconductor layer;
a pair of electrodes positioned in communication with the semiconductor layer and defining a conductive channel in the semiconductor layer;
a gate electrode in communication with the conductive channel and positioned to control conduction of the channel;
the semiconductor layer including an amorphous insulating covalent metal oxide material and an amorphous semiconductor ionic metal oxide material, the amorphous insulating covalent metal oxide material and the amorphous semiconductor ionic metal oxide material being mixed in a predetermined ratio that forms a continuous network of the amorphous semiconductor ionic metal oxide material and prevents the amorphous semiconductor ionic metal oxide material from becoming poly crystalline at processing temperatures;
the mixture of the amorphous insulating covalent metal oxide material and the amorphous semiconductor ionic metal oxide material being deposited on a supporting structure; and
the mixture of the amorphous insulating covalent metal oxide material and the amorphous semiconductor ionic metal oxide material having a carrier concentration determined by one of oxygen and nitrogen being included during the deposition.

21. The thin film semiconductor device as claimed in claim 20 wherein the mixture is deposited in an orientation supported by a substrate in one of a top gate bottom pair of electrodes; top gate top pair of electrodes; bottom gate bottom pair of electrodes; and bottom gate top pair of electrodes configuration.

22. The thin film semiconductor device as claimed in claim 20 wherein the amorphous semiconductor ionic metal oxide is characterized by an energy gap less than approximately 4 ev and the amorphous insulating covalent metal oxide is characterized by an energy gap greater than approximately 6 ev.

23. A thin film semiconductor device comprising:
a semiconductor layer;
a pair of electrodes positioned in communication with the semiconductor layer and defining a conductive channel in the semiconductor layer;
a gate electrode in communication with the conductive channel and positioned to control conduction of the channel;
the semiconductor layer including an amorphous insulating covalent metal oxide material including one of aluminum oxide, silicon oxide, magnesium oxide, beryllium oxide, boron oxide, or combinations thereof and an amorphous semiconductor ionic metal oxide material including one of zinc oxide, indium oxide, tin oxide, gallium oxide, cadmium oxide, or combinations thereof, the amorphous insulating covalent metal oxide material and the amorphous semiconductor ionic metal oxide material being mixed in a predetermined ratio that forms a continuous network of the amorphous semiconductor ionic metal oxide material and prevents the amorphous semiconductor ionic metal oxide material from becoming poly crystalline at processing temperatures;
the mixture of the amorphous insulating covalent metal oxide material and the amorphous semiconductor ionic metal oxide material being deposited on a supporting structure; and
the mixture of the amorphous insulating covalent metal oxide material and the amorphous semiconductor ionic metal oxide material having a carrier concentration determined by one of oxygen and nitrogen being included during the deposition.

24. The thin film semiconductor device as claimed in claim 23 wherein the mixture is deposited in an orientation supported by a substrate in one of a top gate bottom pair of electrodes; top gate top pair of electrodes; bottom gate bottom pair of electrodes; and bottom gate top pair of electrodes configuration.

25. The thin film semiconductor device as claimed in claim 23 wherein the amorphous semiconductor ionic metal oxide is characterized by an energy gap less than approximately 4 ev and the amorphous insulating covalent metal oxide is characterized by an energy gap greater than approximately 6 ev.

* * * * *